(12) United States Patent
Kazuno

(10) Patent No.: US 11,996,811 B2
(45) Date of Patent: May 28, 2024

(54) POWER AMPLIFIER CIRCUIT

(71) Applicant: Murata Manufacturing Co., Ltd., Kyoto (JP)

(72) Inventor: Masafumi Kazuno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 444 days.

(21) Appl. No.: 17/341,953

(22) Filed: Jun. 8, 2021

(65) Prior Publication Data
US 2021/0391835 A1 Dec. 16, 2021

(30) Foreign Application Priority Data

Jun. 10, 2020 (JP) .................................. 2020-101104

(51) Int. Cl.
*H03F 3/195* (2006.01)
*H03F 3/24* (2006.01)

(52) U.S. Cl.
CPC ............ *H03F 3/245* (2013.01); *H03F 3/195* (2013.01); *H03F 2200/451* (2013.01); *H03F 2200/541* (2013.01)

(58) Field of Classification Search
CPC .... H03F 3/245; H03F 3/195; H03F 2200/451; H03F 2200/541; H03F 3/26

USPC ................................................. 330/301, 295
See application file for complete search history.

(56) References Cited

U.S. PATENT DOCUMENTS

| | | | |
|---|---|---|---|
| 8,149,050 B2 * | 4/2012 | Cabanillas | H03F 3/72 330/51 |
| 2004/0095190 A1 * | 5/2004 | Klaren | H03F 3/72 330/124 R |
| 2020/0099348 A1 | 3/2020 | Gebeyehu et al. | |

\* cited by examiner

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A power amplifier circuit includes a first amplifier; a first transformer including a first primary coil connected to an output of the first amplifier and a first secondary coil electromagnetically coupled to the first primary coil; a second amplifier connected to one end of the first secondary coil; a third amplifier connected to another end of the first secondary coil; a second transformer including a second primary coil having one end connected to an output of the second amplifier and another end connected to an output of the third amplifier, and a second secondary coil electromagnetically coupled to the second primary coil; a first capacitance element provided between the second secondary coil and a ground; and a second capacitance element having one end connected to one end of the second secondary coil and another end connected to another end of the second secondary coil.

12 Claims, 5 Drawing Sheets

POWER AMPLIFIER CIRCUIT

CROSS REFERENCE TO RELATED APPLICATION

This application claims priority from Japanese Patent Application No. 2020-101104 filed on Jun. 10, 2020. The content of this application is incorporated herein by reference in its entirety.

BACKGROUND

The present disclosure relates to a power amplifier circuit. In communications in mobile units, such as mobile phones, a power amplifier circuit is used that amplifies a radio frequency (RF) signal. In power amplifier circuits, an increase in efficiency is demanded. To increase the efficiency of power amplifier circuits, there is a power amplifier circuit that perform amplification by using differential signaling.

U.S. Patent Application Publication No. 2020/0099348 discloses a power amplifier circuit in which power is amplified by using differential signaling and good impedance matching appropriate to a frequency band is obtained by a switch switching a connection of a capacitance element on an output side.

In the power amplifier circuit disclosed in U.S. Patent Application Publication No. 2020/0099348, a transformer subjects an input RF signal to unbalanced-to-balanced conversion to thereby split the input signal into differential signals to two amplifiers. For differential signals subjected to the conversion by the transformer, ideally, one signal and the other signal differ in phase by 180 degrees and are equal in amplitude. However, in an actual transformer, parasitic capacitance formed between coils constituting the transformer causes deviations from the ideal phase difference and amplitude difference between differential signals. When differential signals deviate from ideal conditions, power efficiency of an output signal obtained by combining the differential signals decreases.

BRIEF SUMMARY

The present disclosure has been made in consideration of such circumstances and provides a power amplifier circuit that amplifies power by using a differential configuration and exhibits high efficiency.

A power amplifier circuit according to one aspect of the present disclosure includes a first amplifier configured to amplify an input signal; a first transformer including a first primary coil connected to an output of the first amplifier and a first secondary coil coupled to the first primary coil via an electromagnetic field; a second amplifier connected to one end of the first secondary coil; a third amplifier connected to another end of the first secondary coil; a second transformer including a second primary coil having one end connected to an output of the second amplifier and another end connected to an output of the third amplifier, and a second secondary coil coupled to the second primary coil via an electromagnetic field; a first capacitance element provided between the second secondary coil and a ground; and a second capacitance element having one end connected to one end of the second secondary coil and another end connected to another end of the second secondary coil.

Embodiments of the present disclosure can provide the power amplifier circuit that amplifies power by using a differential configuration and exhibits high efficiency.

Other features, elements, characteristics and advantages of the present disclosure will become more apparent from the following detailed description of embodiments of the present disclosure with reference to the attached drawings.

DETAILED DESCRIPTION

Figure 1:
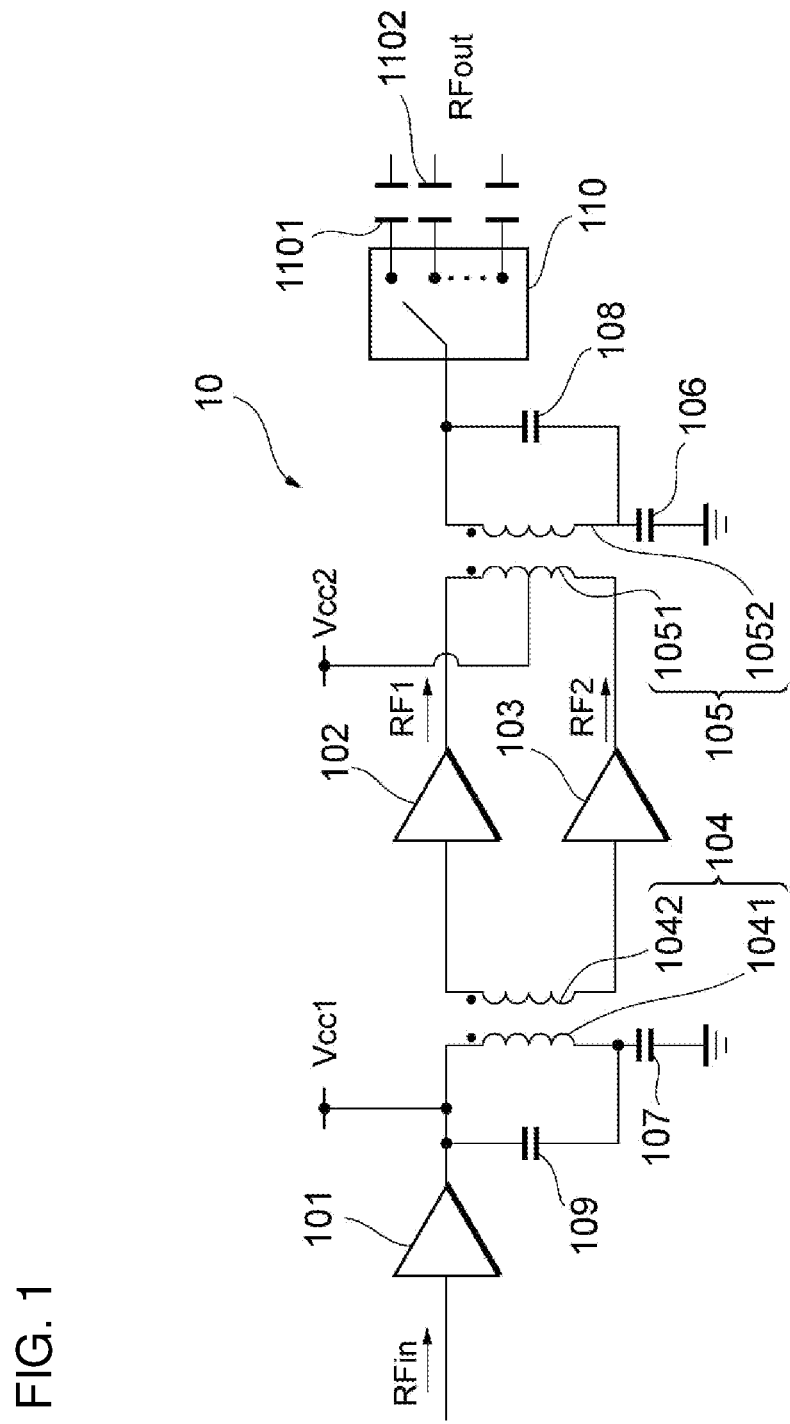
FIG. 1 is a circuit diagram of a power amplifier circuit according to a present embodiment.

An embodiment of the present disclosure will be described in detail below with reference to the drawings. The same elements are denoted by the same reference numerals, and a repeated description thereof is omitted as much as possible.

FIG. 1 is a circuit diagram of a power amplifier circuit 10 according to a present embodiment. The power amplifier circuit 10 includes amplifiers 101, 102, and 103, transformers 104 and 105, capacitance elements 106, 107, 108, and 109, and a switch 110.

An input signal RFin is input to the amplifier 101 (first amplifier). An output of the amplifier 101 is connected to one end of a primary coil 1041 and one end of the capacitance element 109. A power-supply voltage Vcc1 is supplied to the amplifier 101. The amplifier 101 outputs a signal obtained by amplifying the input signal RFin to the transformer 104.

An input of the amplifier 102 (second amplifier) is connected to one end of a secondary coil 1042, and an output thereof is connected to one end of a primary coil 1051. The amplifier 102 amplifies a signal from the transformer 104 and outputs a signal RF1.

An input of the amplifier 103 (third amplifier) is connected to the other end of the secondary coil 1042, and an output thereof is connected to the other end of the primary coil 1051. The amplifier 103 amplifies a signal from the transformer 104 and outputs a signal RF2.

To the amplifiers 102 and 103, a power-supply voltage Vcc2 is supplied through the primary coil 1051 to be described.

Each of the amplifiers 101, 102, and 103 is constituted, for example, by a transistor, such as a heterojunction bipolar transistor (HBT).

The transformer 104 (first transformer) includes the primary coil 1041 (first primary coil) and the secondary coil 1042 (first secondary coil). The primary coil 1041 is coupled to the secondary coil 1042 via an electromagnetic field. The one end of the primary coil 1041 is connected to the output of the amplifier 101, and the other end thereof is connected to a ground through the capacitance element 107.

A signal amplified by the amplifier 101 is input to the primary coil 1041. The transformer 104 subjects a signal input from the amplifier 101 to unbalanced-to-balanced conversion. In accordance with the signal input to the primary coil 1041, signals are output from both ends of the secondary coil 1042. Signals output from both ends of the secondary coil 1042 are almost opposite to each other in phase.

The transformer 105 (second transformer) includes the primary coil 1051 (second primary coil) and a secondary coil 1052 (second secondary coil). The transformer 105 subjects signals input from the amplifiers 102 and 103 to balanced-to-unbalanced conversion. The transformer 105 may be provided such that the primary coil 1051 and the secondary coil 1052 are constituted, for example, by a line of a substrate where the power amplifier circuit 10 is provided.

The primary coil 1051 is connected to the amplifiers 102 and 103 and is coupled to the secondary coil 1052 via an electromagnetic field. One end of the secondary coil 1052 is connected to one end of the capacitance element 108 and is further connected to an input of the switch 110. The other end of the secondary coil 1052 is connected to the other end of the capacitance element 108. The secondary coil 1052 is connected to the ground through the capacitance element 106 connected to the other end of the secondary coil 1052. In other words, the secondary coil 1052 is alternating current (AC)-grounded.

The transformer 105 outputs, from the secondary coil 1052, an output signal RFout based on signals input to the primary coil 1051. The signal RF1 amplified by the amplifier 102 and the signal RF2 amplified by the amplifier 103 are input to the primary coil 1051. The output signal RFout based on the signal RF1 and the signal RF2 is output from the secondary coil 1052. After the input signal RFin having been subjected to unbalanced-to-balanced conversion by the transformer 104 is amplified as the signal RF1 and the signal RF2, the amplified signals are subjected to balanced-to-unbalanced conversion by the transformer 105, and thus the output signal RFout, which is the amplified input signal RFin, is obtained.

The capacitance element 106 (first capacitance element) is provided between the secondary coil 1052 and the ground. The capacitance element 106 adjusts the impedance of the secondary coil 1052 as seen from the output of the amplifier 102 or the output of the amplifier 103. A capacitance value of the capacitance element 106 is, for example, about 2.5 pF.

The capacitance element 107 (third capacitance element) is provided between the primary coil 1041 and the ground. The capacitance element 107 adjusts the impedance of the primary coil 1041 as seen from the output of the amplifier 101. As in the capacitance element 106, the impedance as seen from the input of the amplifier 102 and the input of the amplifier 103 looking toward the primary coil 1041 on an unbalanced side can be adjusted. A capacitance value of the capacitance element 107 is, for example, about 1.1 pF.

The one end of the capacitance element 108 (second capacitance element) is connected to the one end of the secondary coil 1052, and the other end thereof is connected to the other end of the secondary coil 1052. The capacitance element 108 adjusts the impedance of the secondary coil 1052 as seen from the output of the amplifier 102 or the output of the amplifier 103. A capacitance value of the capacitance element 108 is, for example, about 0.2 pF. The capacitance element 108 may be provided in a way that a plate capacitor is provided, for example, by using a line of the substrate where the power amplifier circuit 10 is provided. Alternatively, the capacitance element 108 may be provided as a surface mount device.

The one end of the capacitance element 109 (fourth capacitance element) is connected to the one end of the primary coil 1041, and the other end thereof is connected to the other end of the primary coil 1041. The capacitance element 109 adjusts the impedance of the primary coil 1041 as seen from the output of the amplifier 101. A capacitance value of the capacitance element 109 is, for example, about 0.2 pF.

The switch 110 is a band selection switch that switches, by using a control signal (not illustrated) input from the outside, between destinations for the output signal RFout in accordance with a frequency band. Capacitance elements, such as capacitance elements 1101 and 1102, are connected to respective outputs of the switch 110. When capacitance values of capacitance elements, such as the capacitance elements 1101 and 1102, are adjusted, an appropriate impedance adjustment can be made for each frequency band.

Figure 2:
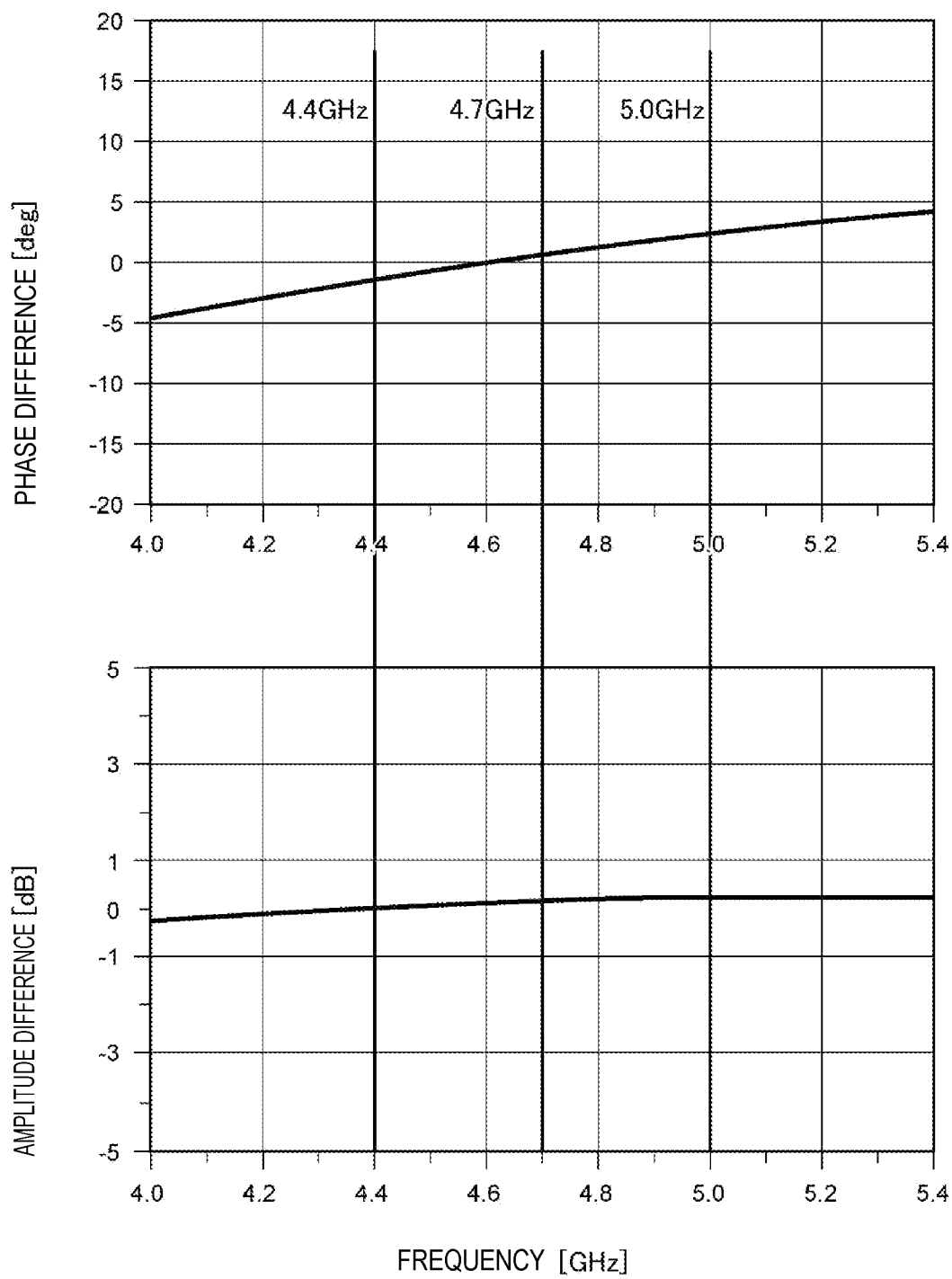
FIG. 2 illustrates the amplitude difference and phase difference between differential signals in the power amplifier circuit according to the present embodiment.

FIG. 2 illustrates simulation results of the phase difference [deg (degree)] and amplitude difference [dB] between the signal RF1 and the signal RF2 exhibited when, in the power amplifier circuit 10, the frequency of the input signal RFin is changed from 4.0 GHz to 5.4 GHz. Here, with reference to the signal RF1, a difference between the signal RF1 and the signal RF2 is indicated. Incidentally, assuming that the phase of the signal RF1 is θ, a phase difference herein refers to a difference between θ and 180 degrees−θ, which is an absolute value of the phase of the signal RF2.

Figure 4:
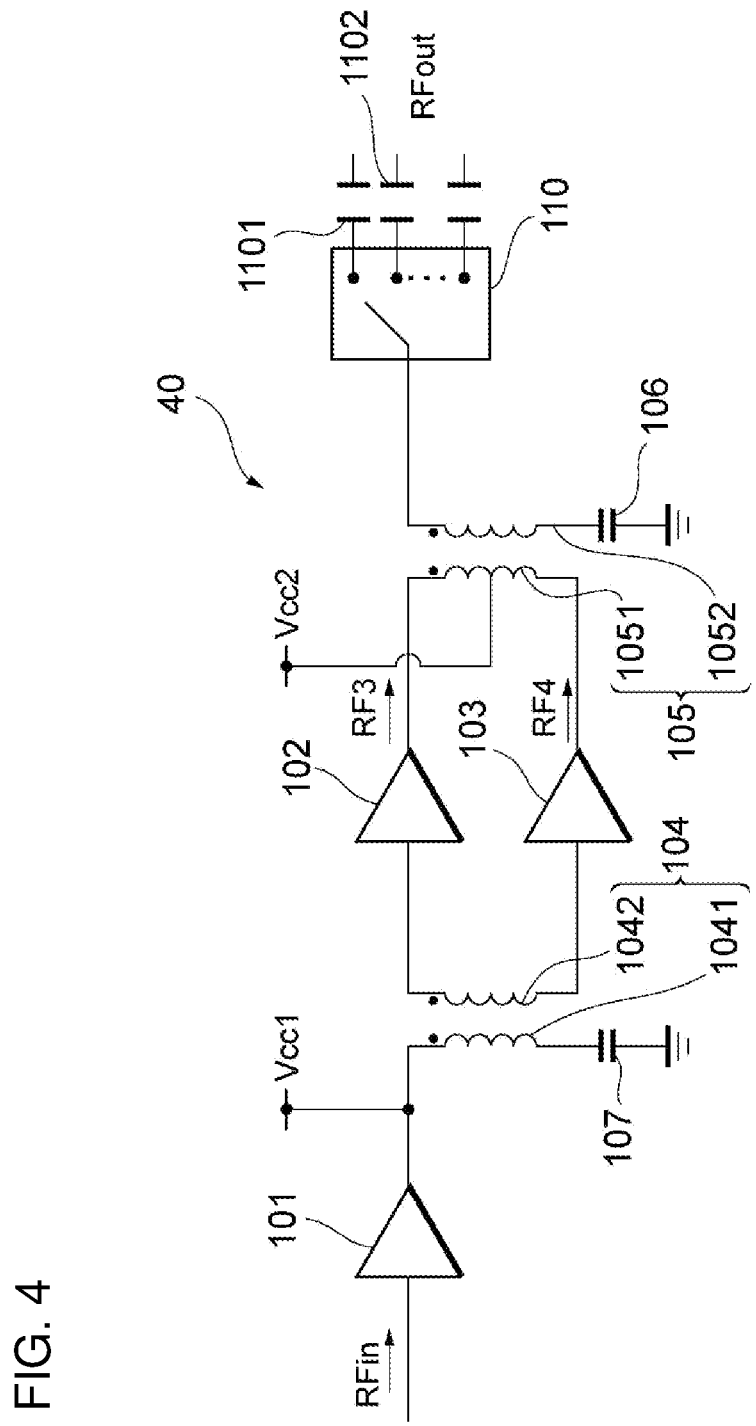
FIG. 4 is a circuit diagram of a power amplifier circuit according to a comparative example.

The results illustrated in FIG. 2 will be described with reference to a comparative example. FIG. 4 is a circuit diagram of a power amplifier circuit 40 as a comparative example. The power amplifier circuit 40 differs from the power amplifier circuit 10 in that the power amplifier circuit 40 does not include the capacitance elements 108 and 109. Furthermore, a signal from the amplifier 102 is denoted by RF3, and a signal from the amplifier 103 is denoted by RF4.

Figure 5:
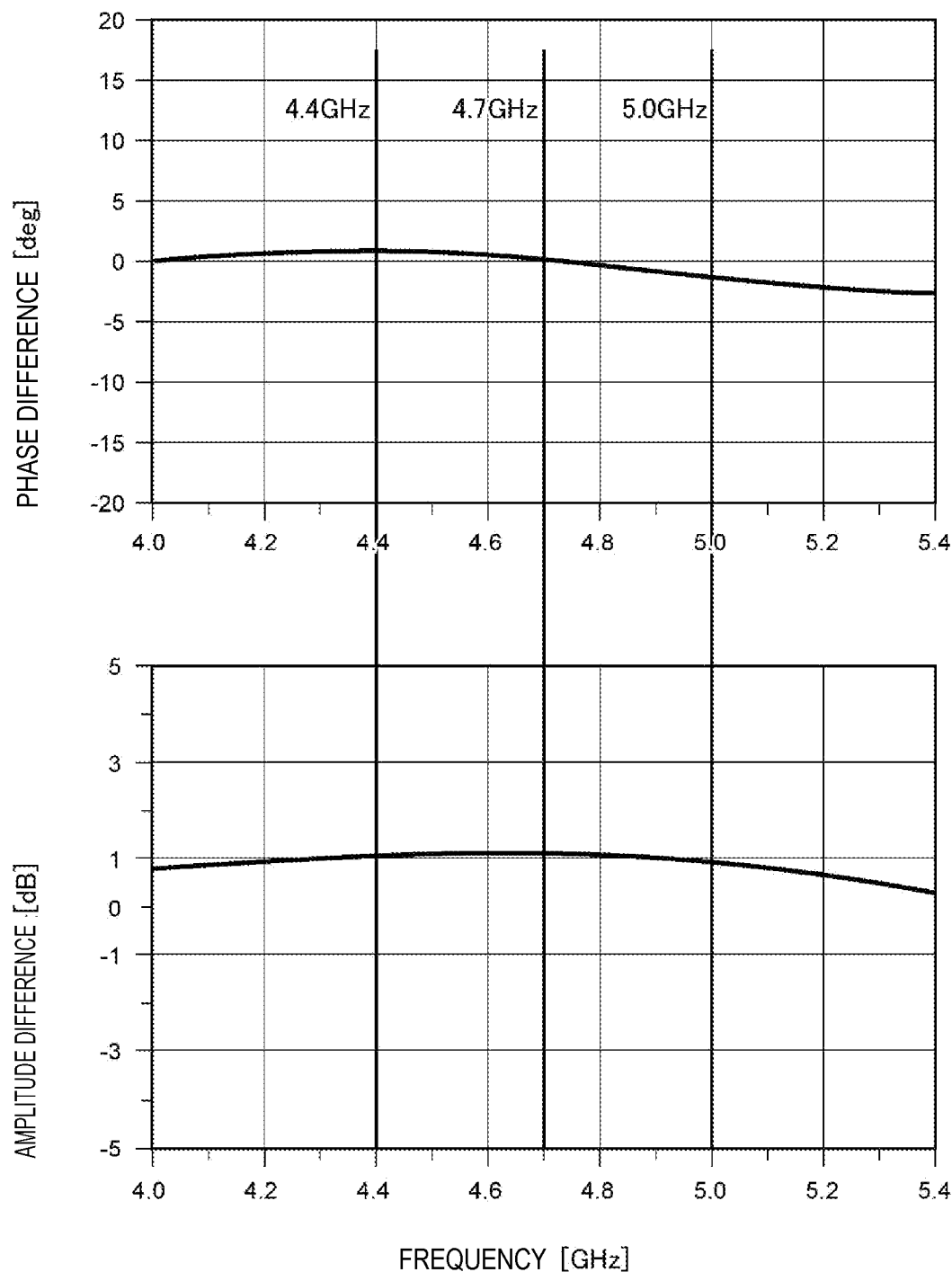
FIG. 5 illustrates the amplitude difference and phase difference between differential signals in the power amplifier circuit according to the comparative example.

FIG. 5 illustrates simulation results of the phase difference [deg] and amplitude difference [dB] between the signal RF3 and the signal RF4 exhibited when, in the power amplifier circuit 40, the frequency of the input signal RFin is changed from 4.0 GHz to 5.4 GHz. Here, with reference to the signal RF3, a difference between the signal RF3 and the signal RF4 is indicated. For a phase difference, a similar calculation method to that in FIG. 2 is employed.

Phase differences [deg] indicated in FIG. 5 are, for example, 0.75 deg at 4.4 GHz, 0.1 deg at 4.7 GHz, and −1.4 deg at 5.0 GHz. Amplitude differences [dB] are 1.05 dB at 4.4 GHz, 1.11 dB at 4.7 GHz, and 0.94 dB at 5.0 GHz.

In the power amplifier circuit 40, the occurrence of the phase difference is suppressed in a band in which a simulation is performed. On the other hand, the amplitude difference occurs over this band.

Phase differences [deg] indicated in FIG. 2 are, for example, −1.23 deg at 4.4 GHz, 0.88 deg at 4.7 GHz, and 2.69 deg at 5.0 GHz. Amplitude differences [dB] are 0.09 dB at 4.4 GHz, 0.22 dB at 4.7 GHz, and 0.28 dB at 5.0 GHz.

In the power amplifier circuit 10, the occurrence of the amplitude difference can be suppressed in a band in which a simulation is performed. Furthermore, the phase difference takes a value near 0 deg in a band from 4.4 GHz to 5.0 GHz. The power amplifier circuit 10 has a frequency band in which the amplitude difference can be suppressed in comparison with the power amplifier circuit 40 while the occurrence of the phase difference is suppressed. Thus, the power amplifier circuit 10 can suppress the phase difference and amplitude difference between differential signals.

Figure 3:
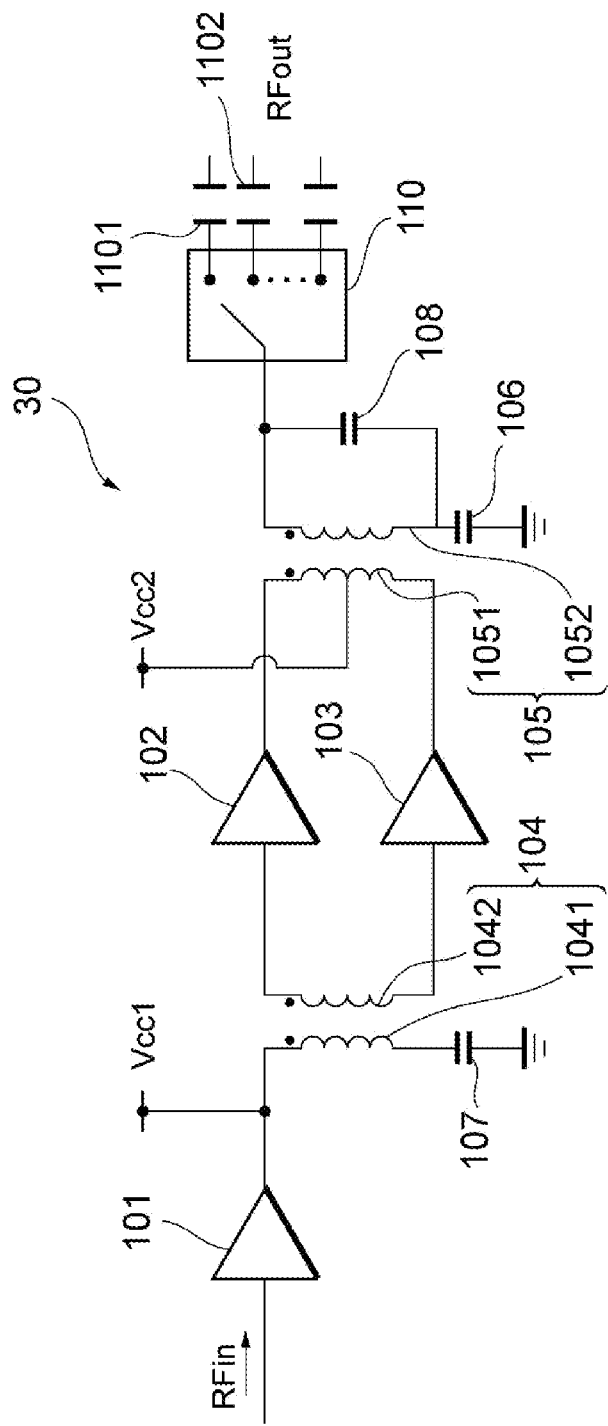
FIG. 3 is another circuit diagram of the power amplifier circuit according to the present embodiment.

FIG. 3 is a circuit diagram of a power amplifier circuit 30. The power amplifier circuit 30 differs from the power amplifier circuit 10 in that the power amplifier circuit 30 does not include the capacitance element 109. However, when the impedance as seen from the output of the amplifier 102 and the output of the amplifier 103 looking toward an output side is adjusted by the capacitance elements 106 and 108, the phase difference and amplitude difference between differential signals can be suppressed as in the power amplifier circuit 10.

In the power amplifier circuits 10 and 30, although the amplifier 101 constituted by one amplifier has been described, a configuration may be employed in which a plurality of amplifiers are coupled in series. In this case, when an output signal is amplified after differential signals are generated by the transformer 104, the oscillation of each power amplifier circuit due to the feedback of the output signal can be suppressed.

The exemplary embodiment of the present disclosure has been described above. The power amplifier circuit 10 includes the amplifier 101 configured to amplify an input signal RFin; the transformer 104 including the primary coil 1041 connected to the output of the amplifier 101 and the secondary coil 1042 coupled to the primary coil 1041 via an electromagnetic field; the amplifier 102 connected to the one end of the secondary coil 1042; the amplifier 103 connected to the other end of the secondary coil 1042; the transformer 105 including the primary coil 1051 having one end connected to the output of the amplifier 102 and the other end connected to the output of the amplifier 103, and the secondary coil 1052 coupled to the primary coil 1051 via an electromagnetic field; the capacitance element 106 provided between the secondary coil 1052 and the ground; and the capacitance element 108 having one end connected to the one end of the secondary coil 1052 and the other end connected to the other end of the secondary coil 1052.

In the power amplifier circuit 10, when the impedance as seen from the output of the amplifier 102 and the output of the amplifier 103 looking toward the output side of the power amplifier circuit 10 is adjusted by the capacitance elements 106 and 108, the occurrence of the phase difference and amplitude difference between differential signals can be suppressed. When the occurrence of the phase difference and amplitude difference is suppressed, power efficiency of an output signal obtained by combining the differential signals can be improved.

The power amplifier circuit 10 further includes the capacitance element 107 provided between the primary coil 1041 and the ground; and the capacitance element 109 having one end connected to the one end of the primary coil 1041 and the other end connected to the other end of the primary coil 1041. Thus, the occurrence of the phase difference and amplitude difference between differential signals can be suppressed further.

In the power amplifier circuit 10, in the transformer 105, the primary coil 1051 and the secondary coil 1052 may be constituted by a line of the substrate where the power amplifier circuit 10 is provided. Thus, in comparison with the case where the transformer 105 is mounted as a component, the number of mounted components can be reduced.

In the power amplifier circuit 10, the capacitance element 108 may be constituted by a line of the substrate where the power amplifier circuit 10 is provided. Thus, the number of mounted components can be reduced.

In the power amplifier circuit 10, the amplifier 101 may be constituted by a plurality of amplifiers coupled in series.

The above-described embodiment is intended to facilitate understanding of the present disclosure but is not intended for a limited interpretation of the present disclosure. The present disclosure can be changed or improved without necessarily departing from the gist thereof and also encompasses equivalents thereof. In other words, appropriate design changes made to the embodiment by those skilled in the art are also encompassed in the scope of the present disclosure as long as the changes have features of the present disclosure. For example, the elements included in the embodiment, and the arrangement, conditions, and so forth of the elements are not limited to those exemplified herein and can be appropriately changed. Furthermore, the embodiment is illustrative, and it goes without necessarily saying that configurations in different embodiments can be partially replaced or combined. Such replacement and combination are also encompassed in the scope of the present disclosure as long as they have features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
   a first amplifier configured to amplify an input signal;
   a first transformer including a first primary coil connected to an output of the first amplifier, and a first secondary coil coupled to the first primary coil via a first electromagnetic field;
   a second amplifier connected to a first end of the first secondary coil;
   a third amplifier connected to a second end of the first secondary coil;
   a second transformer including a second primary coil having a first end connected to an output of the second amplifier, and a second end connected to an output of the third amplifier, and a second secondary coil coupled to the second primary coil via a second electromagnetic field;
   a first capacitance element between the second secondary coil and a ground; and
   a second capacitance element having a first end connected to a first end of the second secondary coil, and a second end connected to a second end of the second secondary coil,
   wherein the second end of the second secondary coil is connected to a node between the first capacitance element and the second capacitance element.

2. The power amplifier circuit according to claim 1, further comprising:
   a third capacitance element between the first primary coil and ground; and
   a fourth capacitance element having a first end connected to a first end of the first primary coil and a second end connected to a second end of the first primary coil.

3. The power amplifier circuit according to claim 1, further comprising:
   a third capacitance element between the first primary coil and ground.

4. The power amplifier circuit according to claim 1, wherein, in the second transformer, the second primary coil and the second secondary coil comprise at least one line of a substrate in or on which the power amplifier circuit is located.

5. The power amplifier circuit according to claim 2, wherein, in the second transformer, the second primary coil and the second secondary coil comprise at least one line of a substrate in or on which the power amplifier circuit is located.

6. The power amplifier circuit according to claim 1, wherein the second capacitance element comprises a line of a substrate in or on which the power amplifier circuit is located.

7. The power amplifier circuit according to claim 2, wherein the second capacitance element comprises a line of a substrate in or on which the power amplifier circuit is located.

8. The power amplifier circuit according to claim 4, wherein the second capacitance element comprises a line of a substrate in or on which the power amplifier circuit is located.

9. The power amplifier circuit according to claim 1, wherein the first amplifier comprises a plurality of amplifiers coupled in series.

10. The power amplifier circuit according to claim 2, wherein the first amplifier comprises a plurality of amplifiers coupled in series.

11. The power amplifier circuit according to claim 4, wherein the first amplifier comprises a plurality of amplifiers coupled in series.

12. The power amplifier circuit according to claim 6, wherein the first amplifier comprises a plurality of amplifiers coupled in series.

* * * * *